(12) United States Patent
Eissa et al.

(10) Patent No.: US 11,972,942 B2
(45) Date of Patent: Apr. 30, 2024

(54) GATE OXIDE FABRICATION AND SYSTEM

(71) Applicant: Texas Instruments Incorporated, Dallas, TX (US)

(72) Inventors: Mona M. Eissa, Allen, TX (US); Corinne Ann Gagnet, Dallas, TX (US); Christopher Scott Whitesell, Garland, TX (US); Pushpa Mahalingam, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 177 days.

(21) Appl. No.: 17/483,286

(22) Filed: Sep. 23, 2021

(65) Prior Publication Data

US 2023/0087463 A1 Mar. 23, 2023

(51) Int. Cl.
*H01L 21/02* (2006.01)

(52) U.S. Cl.
CPC .. *H01L 21/02236* (2013.01); *H01L 21/02164* (2013.01); *H01L 21/02255* (2013.01)

(58) Field of Classification Search
CPC ....... H01L 21/28158–28238; H01L 21/02236; H01L 21/02164; H01L 21/02255; H01L 21/67115; H01L 21/02238; H01L 21/28

See application file for complete search history.

(56) References Cited

U.S. PATENT DOCUMENTS

| 6,239,041 B1 * | 5/2001 | Tanabe | H01L 21/02238 257/E21.639 |
| 2021/0082724 A1 * | 3/2021 | Xie | H01J 37/32422 |
| 2022/0298620 A1 * | 9/2022 | Spuller | H01L 21/02164 |

* cited by examiner

*Primary Examiner* — Julia Slutsker
(74) *Attorney, Agent, or Firm* — Yudong Kim; Frank D. Cimino

(57) ABSTRACT

A method of forming an integrated circuit, including first, positioning a semiconductor wafer in a processing chamber; second, exposing portions of the semiconductor wafer, including introducing a first amount of hydrogen into the processing chamber and introducing a first amount of oxygen into the processing chamber; and, third, introducing at least one of a second amount of hydrogen or a second amount of oxygen into the processing chamber, the second amount of hydrogen greater than zero and less than the first amount of hydrogen and the second amount of oxygen greater than zero and less than the first amount of oxygen.

20 Claims, 3 Drawing Sheets

GATE OXIDE FABRICATION AND SYSTEM

CROSS-REFERENCE TO RELATED APPLICATION

Not applicable.

BACKGROUND

The example embodiments relate to semiconductor fabrication, for example with respect to forming oxides and more particularly gate oxides in integrated circuits (ICs).

ICs pervade all manners of electronic devices, and a fundamental component in many of those ICs are transistors, each with a gate oxide. The gate oxide is a relatively thin dielectric layer, typically of silicon dioxide, between the transistor gate and the transistor channel. The accuracy and integrity of the gate oxide correspondingly affects the accuracy and longevity of the transistor operation, and likewise the accuracy and longevity of the IC in which the transistor is situated. Accordingly, research, development, design, and testing have endeavored to assure various attributes of gate oxides, including for example the amount of operational time before the oxide might breakdown, sometimes referred to as time dependent dielectric breakdown (TDDB). Another gate oxide consideration is optimizing the oxide performance, including its TDDB, for the maximum amount of operational voltage the gate oxide will receive, particularly for relatively high voltage gate oxides (HVGX). Another gate oxide consideration is limiting gate oxide thickness, while still accommodating the expected gate voltage, as HVGX applications typically warrant thicker gate oxides, as compared to lower voltage applications. Still another factor is uniformity of thickness across all gate oxides within an entirety of the semiconductor wafer across which all gate oxides are formed, sometimes referred to as within wafer (WIW) performance.

Accordingly, there may be a need to provide improved gate oxide ICs, and this document provides example embodiments that may improve on certain of the above concepts, as detailed below.

SUMMARY

A method of forming an integrated circuit is described. The method comprises, first, positioning a semiconductor wafer in a processing chamber; second, exposing portions of the semiconductor wafer, including introducing a first amount of hydrogen into the processing chamber and introducing a first amount of oxygen into the processing chamber; and, third, introducing at least one of a second amount of hydrogen or a second amount of oxygen into the processing chamber, the second amount of hydrogen greater than zero and less than the first amount of hydrogen and the second amount of oxygen greater than zero and less than the first amount of oxygen.

Other aspects are also described and claimed.

DETAILED DESCRIPTION

Figure 1:
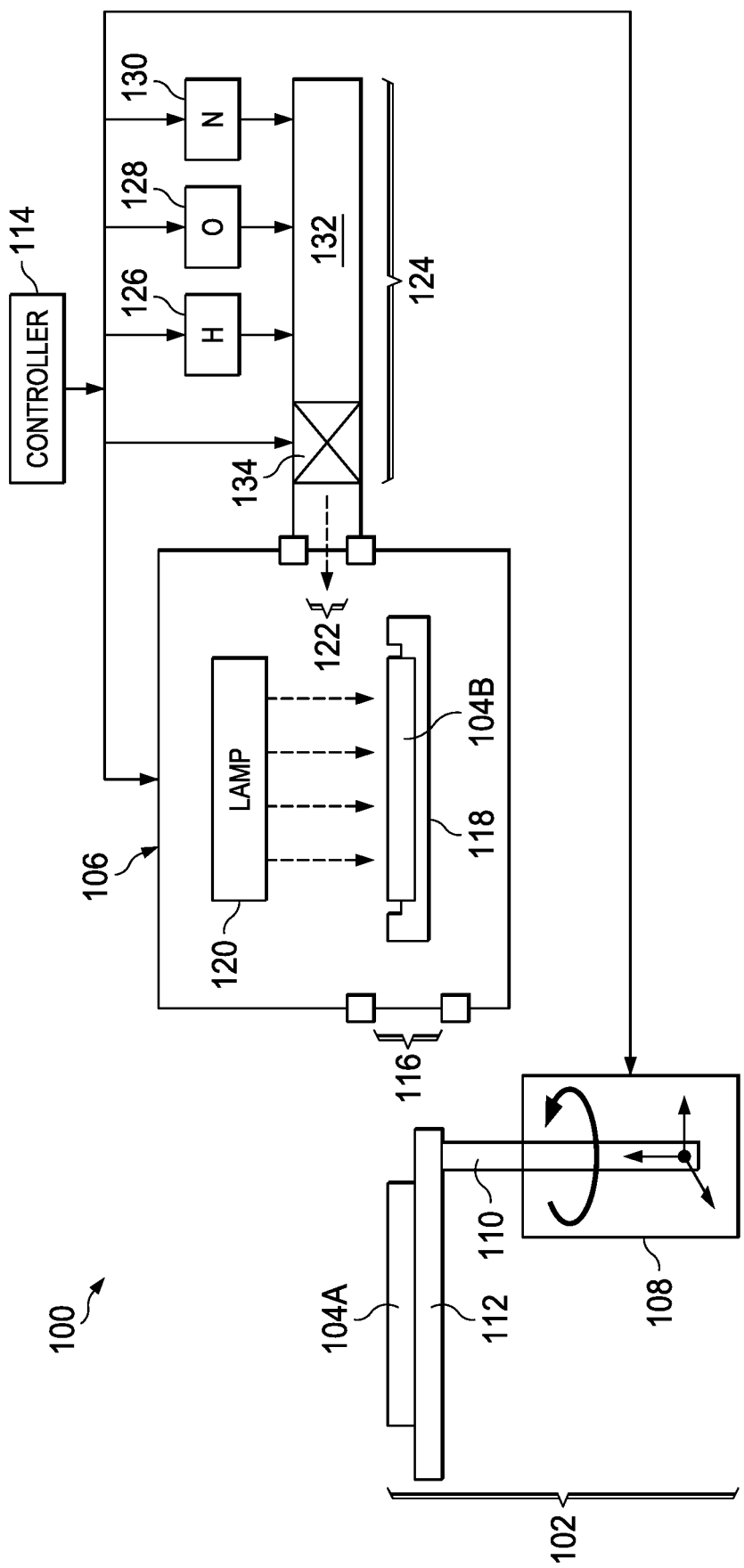
FIG. 1 is a block diagram of an IC fabrication system.

FIG. 1 is a block diagram of an IC fabrication system 100. The system 100 has some attributes known in the art, but is improved as further detailed in this document. Accordingly, only certain aspects are illustrated. In an example embodiment, the system 100 is a single wafer processing system, which is operable to process a single IC semiconductor wafer at a time, and in contrast to batch systems that concurrently process plural wafers. The system 100 includes a robotic handler 102, for moving a semiconductor (e.g., silicon) wafer 104 between the robotic handler 102 and a single wafer chamber 106—for sake of reference, FIG. 1 illustrates the semiconductor wafer 104 as the semiconductor wafer 104A when supported by the robotic handler 102 and as the semiconductor wafer 104B when in the single wafer chamber 106 (or collectively, as the semiconductor wafer 104A/104B). The semiconductor wafer 104A may be positioned relative to the robotic handler 102 in cooperation with other apparatus, for example as received from a wafer cassette or a front opening unified (or universal) pod (FOUP). The wafer also may travel to various other locations for processing, for example for additional steps before and/or after being processed in the single wafer chamber 106. Further, while FIG. 1 illustrates the single wafer chamber 106 as the sole chamber within reach or proximity of the robotic handler 102, other chambers likewise may be within the same proximity, including others that perform other steps in forming gate structures (e.g., nitriding, anneal, polysilicon deposition, and the like).

The robotic handler 102 includes an actuator 108, coupled to and operable to change positions of a shaft 110. For example, the actuator 108 may move the shaft 110 vertically, rotationally, and laterally, as FIG. 1 illustrates via arrows. The shaft 110 is coupled to a platform 112, on which the semiconductor wafer 104A is supported. The system 100 also includes a controller 114, or multiple controllers, which may or may not communicate with all other controllers, and the controller 114 directs the actuator 108 movement and, accordingly, movement of the semiconductor wafer 104A. The controller(s) 114 are programmable/computational devices, known in the art, and include various manners of hardware and software for controlling semiconductor wafer processing. For example, such hardware may include a microprocessor (including a digital signal processor) or microcontroller, computer readable media such as memory, or access to memory, for reading/writing data and programming, and communications (including networking) interfaces for input/output, for example including a user interface through which a user can input, or choose, and execute wafer processing parameters, sometimes referred to in part as a recipe. The software, associated with and stored in the computer readable media of, the controller(s) 114, provides program instructions to the controller hardware, so as to control various processing steps described in this document.

The single wafer chamber 106 includes aspects for receiving and processing the semiconductor wafer 104B. For example, the single wafer chamber 106 includes a first passageway 116, which is proximate the robotic handler 102, and through which the semiconductor wafer 104A/104B is passed to and from the single wafer chamber 106 interior. Specifically, the robotic handler 102 transfers the semiconductor wafer 104A through the first passageway 116 and positions it as the semiconductor wafer 104B within an edge ring 118 that is affixed (e.g., to a chuck, not shown) within the single wafer chamber 106 interior. Once the semiconductor wafer 104B is so positioned, the first passageway 116 is closed, and the semiconductor wafer 104B is processed as further described below. Once the processing is complete, the first passageway 116 is opened, and the robotic handler 102 retrieves the semiconductor wafer 104B from the single wafer chamber 106 interior, after which the semiconductor wafer 104A/104B is passed to an additional chamber, or likely a sequence of respective chambers, for additional processing steps. The single wafer chamber 106 also includes a heat source, such as a lamp 120, which controls temperature across the semiconductor wafer 104B. For example, the lamp 120 may include halogen elements or the like, which may be arranged in a particular pattern, for example in a circle, or in multiple concentric circles, to coincide with different radii of the semiconductor wafer 104A/104B, including its outer geometry. With this arrangement, the lamp 120 may emit different temperatures to different radii of the semiconductor wafer 104A/104B. Also while not shown, the interior of the single wafer chamber 106 also may include other elements, such as a window and reflectors, possibly water cooled, for isolating and directing heat toward the semiconductor wafer 104B. Lastly, the single wafer chamber 106 includes a second passageway 122, for receiving one or more gases, as further detailed below.

To the right in FIG. 1, the IC fabrication system 100 also includes a gas sourcing system 124. The gas sourcing system 124 includes a hydrogen source 126, an oxygen source 128, and a nitrogen source 130, with the flow amount of each under control of the controller 114. Each of the hydrogen, oxygen, and nitrogen sources 124, 126, and 128, is coupled to a supply conduit 132. The supply conduit fluidly communicates with a valve 134, which also may be controlled by the controller 114. The output of the valve 134 fluidly communicates with the second passageway 122, such that when the valve 134 is opened, gas(es) from the supply conduit 132 passes to the interior of the single wafer chamber 106. The valve 134 may represent one or both of two different pressure controls inside the single wafer chamber 106, with one controlling gas flow rate which can impact pressure, and another controlling, for example a throttle valve to the chamber 106, so as to adjust pressure by adjusting the position of the valve.

Figure 2:
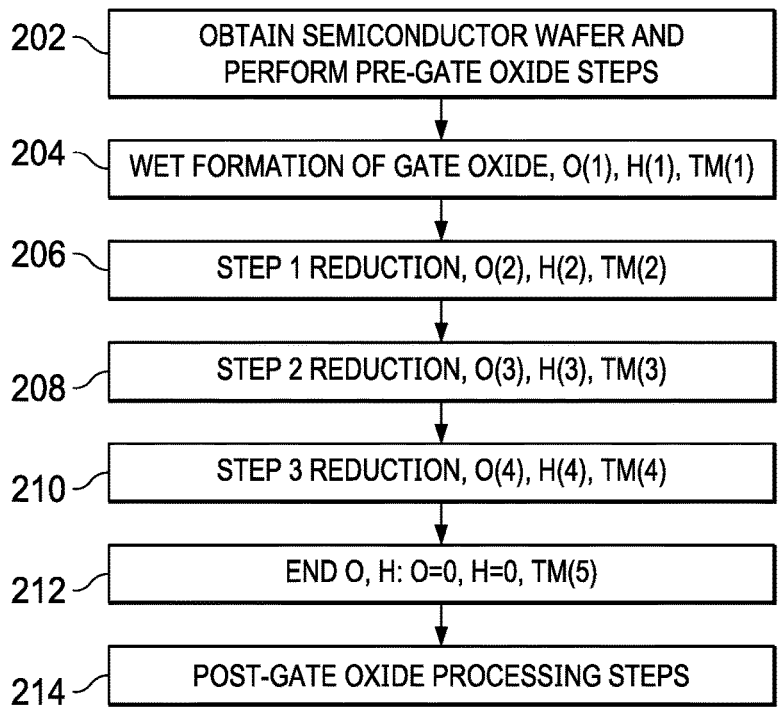
FIG. 2 is a flow diagram of an example embodiment method for operating the FIG. 1 system.

FIG. 2 is a flow diagram of an example embodiment method 200 for operating the FIG. 1 system 100, particularly in connection with IC gate oxide formation on the semiconductor wafer 104A/104B. The method 200 begins in a step 202, in which the FIG. 1 wafer 104A/104B is obtained. The semiconductor wafer 104A/104B, at this stage, will have incurred some earlier processing steps. Such processing steps may include, for example, wafer cleaning (e.g., chemical and/or mechanical), isolation, possible formation of transistor well and/or channel regions, and defining the areas in which gate oxides are to be formed (e.g., by photolithography). Next, the method 200 continues from the step 202 to a step 204.

In the step 204, the system 100 performs a wet thermal oxidation of exposed regions of the semiconductor wafer 104B. Specifically, the controller 114 controls the hydrogen source 126 to establish a first flow rate H(1) of hydrogen and concurrently controls the oxygen source 128 to establish a first flow rate O(1) of oxygen. In an example embodiment, these rates are established so that hydrogen is a percent PT of the combined gases, where, for example, 15%≤PT≤33%.

For example, if PT=15%, then hydrogen is 15% of the combined gases, with oxygen as the remaining 85%, that is, no nitrogen is introduced in the step 204. For example, the step 204 corresponding flow rates are H(1)=6.3 slm and O(1)=35.7 slm, and a first flow rate for nitrogen of N(1)=0. At or around the same time, the controller 114 controls the valve 134 to open. The established flows H(1) and O(1) pass through the supply conduit 132, the valve 134, and the second passageway 122, and into the interior of the single wafer chamber 106. Concurrently, the controller 114 controls the lamp 120 to emit heat at a temperature TMP (e.g., between 1,000° C. and 1,100° C., for example 1,050° C.) and for a duration TM(1) into the interior of the single wafer chamber 106, where TM(1) may be between 60 and 70 seconds (e.g., 65.3 seconds). Accordingly, the hydrogen and oxygen react with any exposed silicon of the semiconductor wafer 104B, creating silicon dioxide gate oxide (Si+ $2H_2O \rightarrow SiO_2+2H_2$) in the areas of such exposure (and leaving excess hydrogen). Still further, also during step 204 (and subsequent steps), the valve 134 may control the pressure within the single wafer chamber 106 to a particular or desired level. In this regard, conventional fabrication limits pressure with a goal of achieving uniform oxide thickness across the wafer; in contrast, in combination with the other attributes described herein, the example embodiment establishes pressure 1-2 torr higher than the pressure that nominally would achieve uniform temperature probe offsets. In other words, the pressure is set to a level to achieve a temperature differential TD creating a cooler temperature along the outer radius than at the center of the semiconductor wafer 104A/104B, where 1° C.≤TD≤15° C. Next, the method 200 continues from step 204 to a step 206.

In the step 206, the controller 114 controls the hydrogen source 126 and the oxygen source 128, to establish a second non-zero flow rate H(2) of hydrogen and a second non-zero flow rate O(2) of oxygen, respectively. In an example embodiment, one of the hydrogen and oxygen rates (or both, concurrently) are reduced relative to the step 204, that is, either or both 0<H(2)<H(1) and 0<O(2)<O(1). Further, as the controller 114 reduces both hydrogen and oxygen flow, it concurrently controls the nitrogen source 130 to introduce some amount of nitrogen, N(2), into the supply conduit 132 and then into the single wafer chamber 106, with the nitrogen being inert to the oxidation process. Also in an example embodiment, the oxygen/hydrogen ratio in step 206 is approximately the same (within 97% to 103%) as the oxygen/hydrogen ratio from step 204. Accordingly, in an example embodiment, the step 206 rates are established so that hydrogen remains approximately 15% of the combination of hydrogen and oxygen, but not to include nitrogen, while nitrogen may be introduced at a relatively lower flow rate. For example, the step 206 corresponding flow rates are H(2)=4.7 slm, O(2)=26.8 slm, and N(2)=2.5 slm. At the same time, the controller 114 controls the lamp 120 to continue to emit heat at the temperature TMP (e.g., 1,050° C.), and the levels of H(2), O(2), and N(2) are maintained for a duration TM(2), where TM(2) may be in the range of 0.5 to 1.5 seconds (e.g., TM(2)=1.0 second). Next, the method 200 continues from the step 206 to a step 208.

In the step 208, the controller 114 controls the hydrogen source 126 and the oxygen source 128, to establish a third non-zero flow rate H(3) of hydrogen and a third non-zero flow rate O(3) of oxygen, respectively, further reducing one of the hydrogen and oxygen rates (or both, concurrently) relative to the step 204 (and step 206), that is, either or both 0<H(3)<H(2) and 0<O(3)<O(2). Also in an example embodiment, the oxygen/hydrogen ratio in the step 208 is approximately the same (within 97% to 103%) as the oxygen/hydrogen ratio from both the steps 204 and 206, again maintaining hydrogen at approximately 15% of the combination of hydrogen and oxygen. Concurrently, the controller 114 controls the nitrogen source 130 to introduce an additional amount of nitrogen, N(3), into the supply conduit 132 and then into the single wafer chamber 106. For example, the step 208 corresponding flow rates are H(3)=3.1 slm, O(3)=17.9 slm, and N(3)=5.0 slm. The controller 114 continues to controls the lamp 120 to maintain the temperature TMP (e.g., 1,050° C.), and the levels of H(3), O(3), and N(3) are maintained for a duration TM(3). In an example embodiment, the duration of TM(3) is the same as the duration of the step 206 TM(2) (e.g., one second). Next, the method 200 continues from the step 208 to a step 210.

In the step 210, with the controller 114 having twice reduced one or both of the hydrogen source 126 and the oxygen source 128 in the respective steps 206 and 208, the controller for a third time again reduces those sources 126 and 128 (or both, concurrently), thereby establishing a fourth non-zero flow rate H(4) of hydrogen and a fourth non-zero flow rate O(4) of oxygen, respectively, relative to the steps 204, 206, and 208, that is, either or both 0<H(4)<H(3) and 0<O(4)<O(3). Once more in an example embodiment, the oxygen/hydrogen ratio in the step 210 is approximately the same (within 97% to 103%) as the oxygen/hydrogen ratio from the steps 204, 206, and 208. Concurrently, the controller 114 controls the nitrogen source 130 to introduce an additional amount of nitrogen, N(4), into the supply conduit 132 and then into the single wafer chamber 106. For example, the step 210 corresponding flow rates are H(4)=1.6 slm, O(4)=8.9 slm, and N(4)=7.5 slm. The controller 114 continues to controls the lamp 120 to maintain the temperature TMP, and the levels of H(4), O(4), and N(4) are maintained for a duration TM(4). In an example embodiment, the duration of TM(4) is the same as the duration of the step 206 TM(2) and the step 208 TM(3) (e.g., one second). Next, the method 200 continues from the step 210 to a step 212.

In the step 212, the controller 114 controls the hydrogen source 126 and the oxygen source 128 again to reduce hydrogen and oxygen respectively, and where each of steps 206, 208, and 210 provided a reduced non-zero level of hydrogen and/or oxygen, and while such reductions could continue in more than three steps, when the step 212 is reached, both of the hydrogen and oxygen flows are reduced to zero. The zero level is maintained for a duration TM(5), which is preferably longer than the durations TM(2), TM(3), and TM(4). Concurrently, the controller 114 controls the nitrogen source 130 to introduce an additional amount of nitrogen, N(5), into the supply conduit 132 and then into the single wafer chamber 106, for example with N(5)=10.0 slm. In example embodiment, during the TM(5) duration, the controller 114 controls the lamp 120 to linearly reduce the temperature, from TM(4) to a lower value TM(5). For example, over a duration TM(5)=25.0 seconds, a linearly downward ramp may be from 1,050° C. to 600° C., completing the oxide-growth steps of the method 200. Next, the method 200 continues from the step 212 to a step 214.

In the step 214 and following, post-gate oxide processes are performed, so as to complete any circuit features, connections, and the like for ICs of the semiconductor wafer 104A/104B. In this regard, the controller 114 can control the robotic handler 102 to retrieve the semiconductor wafer 104B from the single wafer chamber 106, from where it is advanced to other wafer processing equipment for additional processing. Thereafter, each IC formed on the wafer can be separated from the wafer, packaged, tested, and ultimately if satisfactory, approved for distribution, such as by sale and delivery to a customer.

Figure 3:
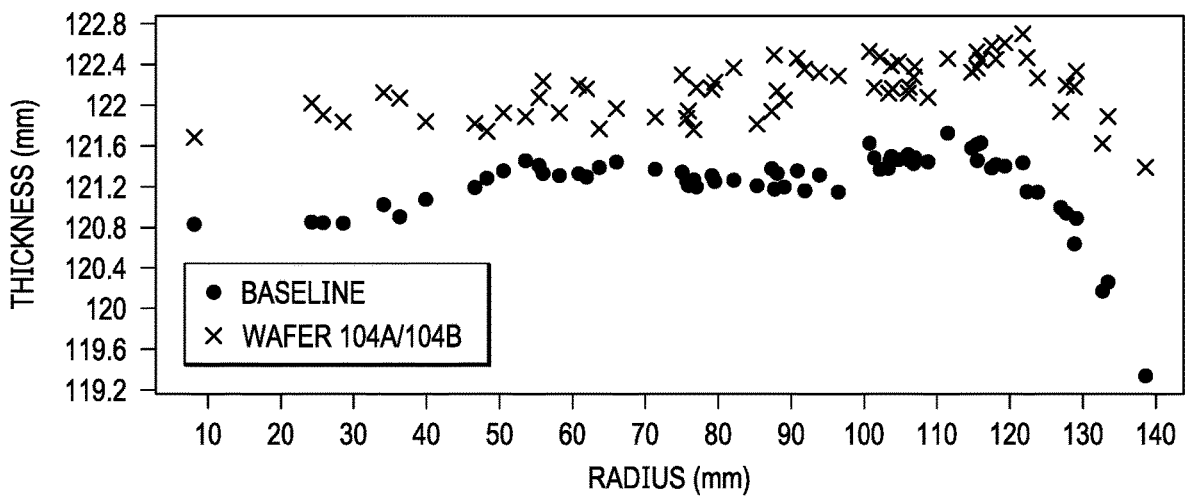
FIG. 3 is an oxide thickness plot across a semiconductor wafer.

FIG. 3 is an oxide thickness plot 300 across a semiconductor wafer. The FIG. 3 horizontal axis illustrates wafer radius from its center point indicated at radius=0, and the vertical axis illustrates oxide thickness, with both measures in millimeters (mm) The oxide thickness plot 300 has two sets of data points, a first data set (shown as x's) corresponding to the semiconductor wafer 104A/104B from the example embodiment and a second data set (shown as o's) corresponding to a wafer resulting from an alternative baseline process, for example in which the FIG. 2 reduction steps 206, 208, and 210 are eliminated, in which case hydrogen/oxygen are reduced from an oxidation level directly to zero flow. The second data set demonstrates considerable oxide thickness variability, particularly as radius increases, that is, toward the outer edge of the semiconductor wafer, for example, between radii of 120 mm and 138 mm. In contrast, the example embodiment first data set shows a much greater oxide thickness for the semiconductor wafer 104A/104B. Indeed, the following Table 1 lists various measures comparing the first and second data sets:

TABLE 1

| Oxide thickness | First data set | Second data set |
| --- | --- | --- |
| Average | 123.72 | 122.57 |
| Minimum | 121.8 | 119.6 |
| Maximum | 124.4 | 123.4 |
| Standard deviation | 0.68 | 0.98 |
| Range | 2.60 | 3.72 |

From Table 1, the range (difference between maximum and minimum) and standard deviation are notably improved in the first data set, as compared to the second data set. Accordingly, the example embodiment, while implementing a wet (steam) creation of oxides (e.g., for transistor gates), nonetheless provides a potential of more uniform oxide (for transistor gates) thickness across the entire radius of the semiconductor wafer, thereby improving WIW performance.

Figure 4:
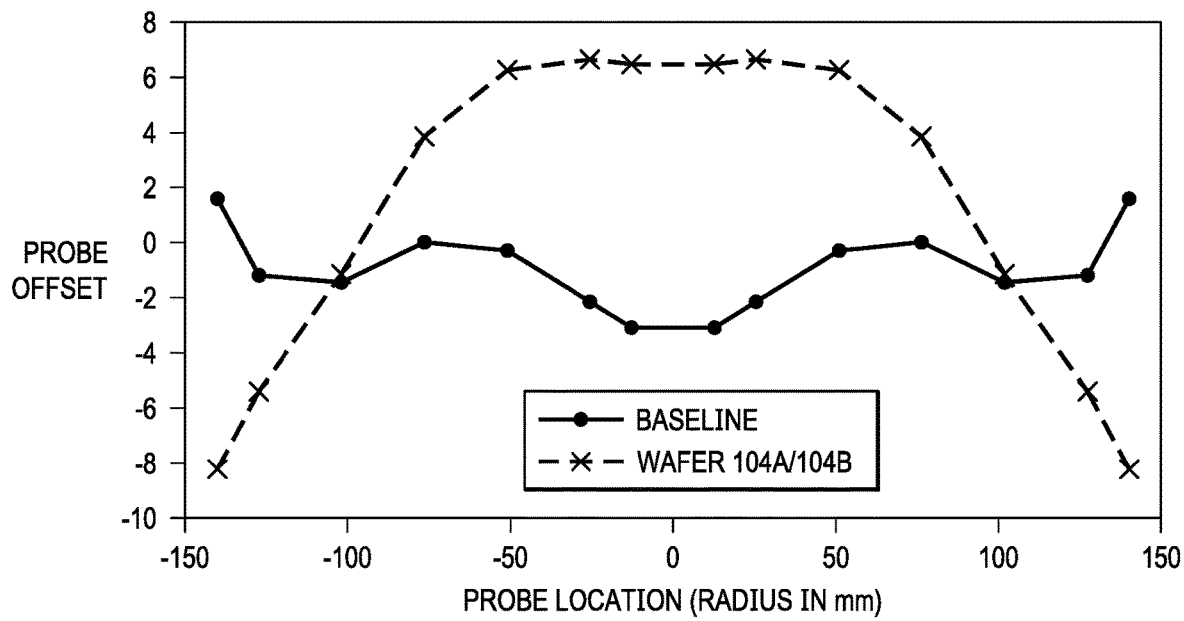
FIG. 4 is a probe offset profile plot across a semiconductor wafer.

FIG. 4 is a probe offset profile plot 400 across a semiconductor wafer. The FIG. 4 horizontal axis illustrates wafer radius (in mm) outward, in two directions from a center point of radius=0, toward outer radius of −150 mm in one direction and +150 mm in the opposite direction, and the vertical axis illustrates probe offset. Probe offset relates to the amount of detected wafer slip, which is a measure of wafer defectivity concern where it occurs near the outer edge of the wafer due to processing. Wafer slip near the wafer edge can cause various undesirable issues, including for example an effort to provide temperature corrections at the wafer edge, which also may reduce oxide thickness uniformity. The plot 400 has two sets of data points. A first FIG. 4 data set (shown as x's) corresponds to the semiconductor wafer 104A/104B from the example embodiment. Moreover, also within an example embodiment, the oxide thickness profile across the wafer is designed specifically to create the example embodiment temperature probe offset profile in FIG. 4, by setting the pressure within a desirable range. Moreover, the pressure set point can be used to match chambers across the fleet of tools to get the exact same temperature offset profile and uniformity, without tuning additional recipe parameters. In contrast, a second FIG. 4 data set (shown as solid o's) corresponds to a wafer resulting from an alternative baseline process, again for example in which the FIG. 2 reduction steps 206, 208, and 210 are eliminated. The second data set demonstrates that beyond a radius of approximately ±100 mm, probe offset increases, indicating a greater incidence of slips near and at the wafer edge. In contrast, the example embodiment first data set shows that probe offset steadily declines in the same area. Accordingly, the example embodiment provides improved slip margin and may reduce or eliminate any need for temperature correction at the wafer edge.

Figure 5:
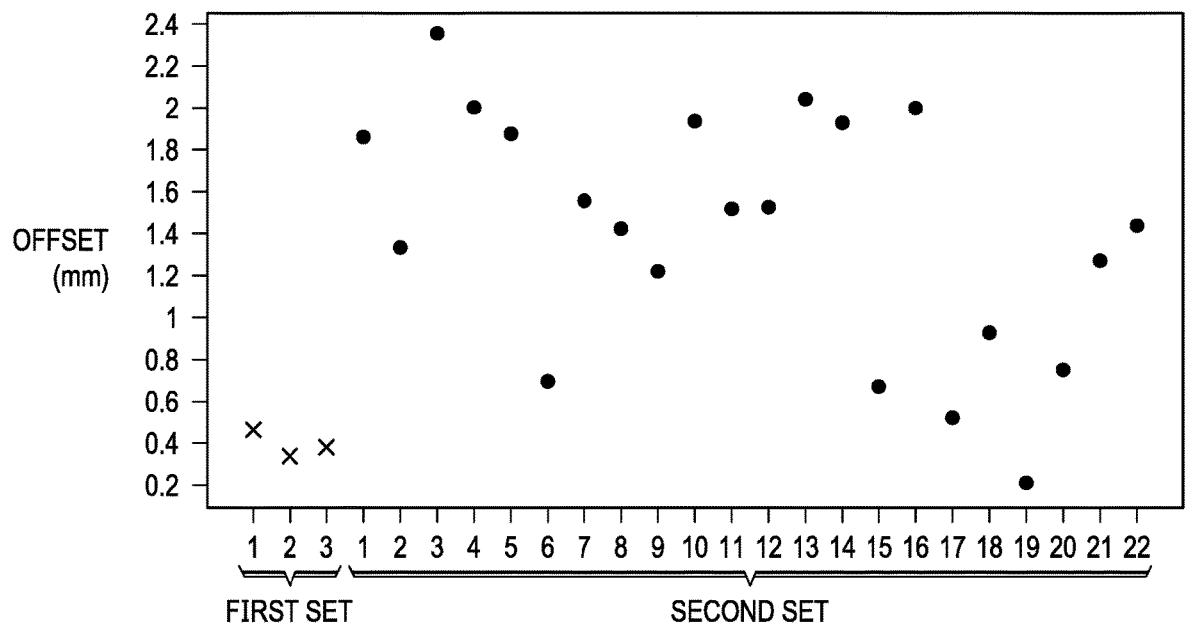
FIG. 5 is a center error plot, indicating a distance measure of movement of the semiconductor wafer from its intended position in a processing chamber.

FIG. 5 is a center error plot 500, indicating a distance measure of movement of a semiconductor wafer from its intended position in a processing chamber, for example centered in the FIG. 1 edge ring 118. More particularly, processing in a semiconductor chamber is known in some instances to create movement of the wafer, including center movement and popping of the wafer edges relative to the intended edge position of the edge ring 118. Movement of the wafer in this manner may cause various alignment issues, including non-uniform temperature application (which can further cause wafer warping and breakage), and misaligned handoff to the robotic handler 102. The FIG. 5 horizontal axis illustrates test incidence and the vertical axis illustrates offset from intended center, in millimeters (mm) The plot 300 has two sets of data points, a first data set (shown as x's) corresponding to the semiconductor wafer 104A/104B from the example embodiment and a second data set (shown as solid o's) corresponding to a wafer from an alternative baseline process, again for example in which the FIG. 2 reduction steps 206, 208, and 210 are eliminated. The second data set demonstrates considerably larger variability and absolute magnitude in offset, while the first data set demonstrates low and relatively stable offset, where each resultant wafer has an offset less than 0.6 mm. Accordingly, the negative effects of larger offset are potentially mitigated by the example embodiment.

From the above, one skilled in the art should appreciate that example embodiments are provided for IC semiconductor fabrication, for example with respect to improving oxides, including transistor gate oxides. Such embodiments provide various benefits, some of which are described above and including still others. For example, example embodiments may be implemented in various technologies, including linear bi-CMOS (LBC) and bi-polar CMOS/DMOS (BCD) technologies. As other examples, semiconductor wafer oxides, including HVGX, may be formed with improved WIW thickness non-uniformity, reduced slips, and reduced wafer positioning offset (e.g., misalignment, out of pocket position, and the like). Yet another benefit is a relatively thick oxide, without the need for a dry oxidation process, typically requiring higher (furnace) temperatures. Still another benefit is acceptable TDDB, that is, time to failure being increased as compared to tested traditional dry process. Still further, one or more of the benefits may be achieved using existing tools, with relatively faster cycle times, thereby avoiding cost increases. As a final example, additional modifications are possible in the described embodiments, and other embodiments are possible, within the scope of the following claims.

What is claimed is:

1. A method of forming an integrated circuit, the method comprising:
   a first step including positioning a semiconductor wafer in a processing chamber;
   a second step including exposing portions of the semiconductor wafer with:
      introducing a first amount of hydrogen into the processing chamber; and
      introducing a first amount of oxygen into the processing chamber, wherein a first temperature along an outer radius of the semiconductor wafer is less than a second temperature at a center radius of the semiconductor wafer; and
   a third step including introducing a second amount of hydrogen and a second amount of oxygen into the processing chamber, wherein the second amount of hydrogen is greater than zero and less than the first amount of hydrogen or the second amount of oxygen is greater than zero and less than the first amount of oxygen.

2. The method of claim 1 and further including:
   a fourth step with:
      reducing an amount of hydrogen in the processing chamber to zero;
      reducing an amount of oxygen in the processing chamber to zero; and
   a fifth step including removing the semiconductor wafer from the processing chamber.

3. The method of claim 2 and further including, between the third and fourth steps, introducing a third amount of hydrogen and a third amount of oxygen into the processing chamber, wherein the third amount of hydrogen is greater than zero and less than the second amount of hydrogen or the third amount of oxygen greater than zero and less than the second amount of oxygen.

4. The method of claim 3 wherein:
   the third amount of hydrogen is greater than zero and less than the second amount of hydrogen; and
   the third amount of oxygen is greater than zero and less than the second amount of oxygen.

5. The method of claim 4 wherein a ratio of the third amount of hydrogen to the third amount of oxygen is within 97 percent to 103 percent of a ratio of the second amount of hydrogen to the second amount of oxygen.

6. The method of claim 4 and further including heating the third amount of hydrogen and the third amount of oxygen inside the processing chamber.

7. The method of claim 4 wherein the third amount of hydrogen and the third amount of oxygen are introduced into the processing chamber for a same period of time that the second amount of hydrogen and the second amount of oxygen are introduced into the processing chamber.

8. The method of claim 2 and further including, between the third and fourth steps:
   introducing a third amount of hydrogen and a third amount of oxygen into the processing chamber, wherein the third amount of hydrogen is greater than zero and less than the second amount of hydrogen or the third amount of oxygen greater than zero and less than the second amount of oxygen; and
   introducing a fourth amount of hydrogen and a fourth amount of oxygen into the processing chamber, wherein the fourth amount of hydrogen is greater than zero and less than the third amount of hydrogen or the fourth amount of oxygen is greater than zero and less than the third amount of oxygen.

9. The method of claim 8:
   wherein the third amount of hydrogen is greater than zero and less than the second amount of hydrogen, and the third amount of oxygen is greater than zero and less than the second amount of oxygen; and
   wherein the fourth amount of hydrogen is greater than zero and less than the third amount of hydrogen, and the fourth amount of oxygen is greater than zero and less than the third amount of oxygen.

10. The method of claim 9:
wherein a ratio of the third amount of hydrogen to the third amount of oxygen is within 97 percent to 103 percent of a ratio of the second amount of hydrogen to the second amount of oxygen; and
wherein a ratio of the fourth amount of hydrogen to the fourth amount of oxygen is within 97 percent to 103 percent of a ratio of the third amount of hydrogen to the third amount of oxygen.

11. The method of claim 9:
wherein the fourth amount of hydrogen and the fourth amount of oxygen are introduced into the processing chamber for a first same period of time that the third amount of hydrogen and the third amount of oxygen are introduced into the processing chamber; and
wherein the third amount of hydrogen and the third amount of oxygen are introduced into the processing chamber for a second same period of time that the second amount of hydrogen and the second amount of oxygen are introduced into the processing chamber.

12. The method of claim 11 wherein the fourth step of reducing an amount of hydrogen in the processing chamber to zero and reducing an amount of oxygen in the processing chamber to zero is over a period of time greater than the first same period of time and the second same period of time.

13. The method of claim 1 wherein:
the second amount of hydrogen is greater than zero and less than the first amount of hydrogen; and
the second amount of oxygen is greater than zero and less than the first amount of oxygen.

14. The method of claim 1, wherein:
introducing the first amount of hydrogen into the processing chamber includes introducing the first amount of heated hydrogen into the processing chamber; and
introducing the first amount of oxygen into the processing chamber includes introducing the first amount of heated oxygen into the processing chamber.

15. The method of claim 1 wherein the processing chamber is a single wafer processing chamber.

16. The method of claim 1 wherein the processing chamber is a first processing chamber, and further including:
a fourth step including:
reducing an amount of hydrogen in the processing chamber to zero; and
reducing an amount of oxygen in the processing chamber to zero;
a fifth step including removing the semiconductor wafer from the processing chamber; and
a sixth step including processing the semiconductor wafer in a second processing chamber.

17. A method of forming an integrated circuit, the method comprising:
forming a gate oxide using wet thermal oxidation by:
positioning a semiconductor wafer in a single wafer chamber;
heating the single wafer chamber to a first temperature;
while at the first temperature, exposing portions of the semiconductor wafer to hydrogen at a first hydrogen flow rate and oxygen at a first oxygen flow rate with a first nitrogen flow rate of zero to form the gate oxide;
then and while still at the first temperature:
reducing the first hydrogen flow rate to a second hydrogen flow rate;
reducing the first oxygen flow rate to a second oxygen flow rate; and
increasing the first nitrogen flow rate of zero to a second nitrogen flow rate greater than zero;
then and while still at the first temperature:
reducing the second hydrogen flow rate to a third hydrogen flow rate;
reducing the second oxygen flow rate to a third oxygen flow rate; and
increasing the second nitrogen flow rate to a third nitrogen flow rate; and
then applying a fourth hydrogen flow rate of zero, a fourth oxygen flow rate of zero and a fourth nitrogen flow rate greater than the third nitrogen flow rate during a temperature ramp down process reducing the first temperature to a second temperature.

18. The method of claim 17:
wherein the first hydrogen flow rate and the first oxygen flow rate are such that the portions of the semiconductor wafer are exposed to a combination of resultant hydrogen and oxygen; and
wherein hydrogen is a percent PT of the combination and $15\% \leq PT \leq 33\%$.

19. The method of claim 17:
wherein the first hydrogen flow rate and the first oxygen flow rate are such that the portions of the semiconductor wafer are exposed to a first combination of resultant hydrogen and oxygen;
wherein hydrogen is a first percent PT1 of the first combination and $15\% \leq PT \leq 33\%$;
wherein the second hydrogen flow rate and the second oxygen flow rate are such that the portions of the semiconductor wafer are exposed to a second combination of resultant hydrogen and oxygen;
wherein hydrogen is a second percent PT2 of the second combination and $15\% \leq PT2 \leq 33\%$;
wherein the third hydrogen flow rate and the third oxygen flow rate are such that the portions of the semiconductor wafer are exposed to a third combination of resultant hydrogen and oxygen; and
wherein hydrogen is a third percent PT3 of the third combination and $15\% \leq PT3 \leq 33\%$.

20. The method of claim 17 wherein the semiconductor wafer includes a center and an outer radius, and the method further comprises, establishing pressure within the single wafer chamber to achieve a temperature differential TD creating a cooler temperature along the outer radius than at the center, where $1° C. \leq TD \leq 15° C$.

* * * * *